United States Patent [19]

Bennett et al.

[11] Patent Number: 4,808,434
[45] Date of Patent: Feb. 28, 1989

[54] PROCESS FOR APPLICATION OF OVERLAY CONDUCTORS TO SURFACE OF PRINTED CIRCUIT BOARD ASSEMBLIES

[75] Inventors: Reginald B. P. Bennett, Oakville; Allan R. Drake, Brampton; Roger C. Finn, Kanata, all of Canada

[73] Assignee: Northern Telecom Limited, Montreal, Canada

[21] Appl. No.: 102,696

[22] Filed: Sep. 30, 1987

[30] Foreign Application Priority Data

Jul. 6, 1987 [CA] Canada ................................. 541394

[51] Int. Cl.⁴ ........................... B05D 3/06; B05D 5/12
[52] U.S. Cl. ...................................... 427/54.1; 427/55; 427/96
[58] Field of Search ........................... 427/54.1, 55, 96

[56] References Cited
U.S. PATENT DOCUMENTS 4,479,983 10/1984 Appelt et al. ..................... 427/96 X
4,487,811 12/1984 Erchelberger et al. .......... 427/96 X
4,535,012 8/1985 Martin et al. ..................... 427/96 X
4,704,305 11/1987 Berger et al. ........................ 427/96

Primary Examiner—Michael Lusignan
Attorney, Agent, or Firm—F. P. Turnpin

[57] ABSTRACT

The invention provides a method of applying an overlay conductor between at least a pair of connection land areas on a surface of a printed circuit board. The pattern of the conductor is first defined by the application of a dielectric material between the pair of land areas. A silver polymer ink is then applied over the dielectric material and over only a portion of each land area. The polymer ink is then cured by exposure to a source of heat. The pair of land areas and at least the portion of the cured ink overlaying the land areas are then covered with silver solder paste which is subsequently reflowed by exposure to a source of heat and allowed to solidify thereby attaching the conductor to the land area and providing a secure conductive connection.

18 Claims, 4 Drawing Sheets

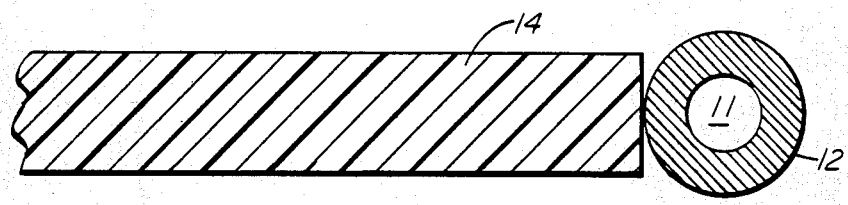
FIG. IA
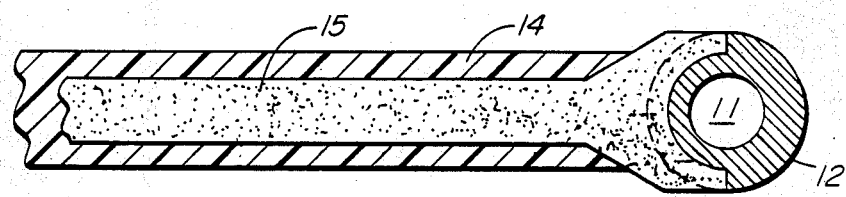
FIG. IB
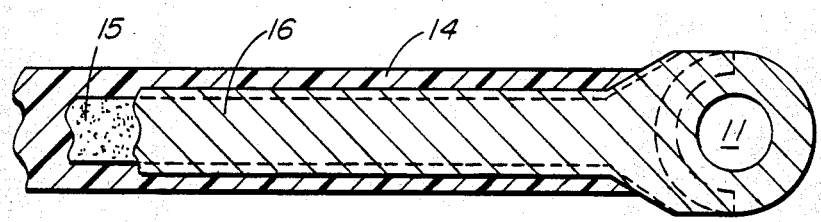
FIG. IC
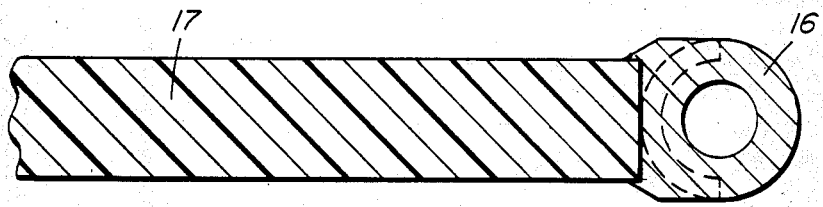
FIG. ID

PROCESS FOR APPLICATION OF OVERLAY CONDUCTORS TO SURFACE OF PRINTED CIRCUIT BOARD ASSEMBLIES

The invention relates to printed circuit boards generally and more particularly to a process of applying overlay conductors or barnacles over an existing printed circuit board.

BACKGROUND OF THE INVENTION

Contemporary computer and telecommunication equipment is usually realized through the use of printed circuit card assemblies. The printed circuit boards comprise a flat substrate material having one or more layers of circuit conductors on one or both sides thereof. In view of the complexity of some circuits and components, a printed circuit board may be a very complex and hence a very expensive device to realize a circuit. In the design process of a system, it is quite often necessary to alter the circuit and hence the original pattern of conductors printed on the substrate. Since the redesign of a printed circuit board is a very expensive exercise, the problem of last-minute engineering changes is usually solved by applying overlay conductors over the original printed circuit.

In other instances, especially when a system performance is enhanced or modified for any reason, it is very often necessary to modify the printed pattern of conductors of some printed circuit card assemblies. This is again achieved through the use of overlay conductors or barnacles as they are often referred to in the art.

To this day, change interconnections are usually achieved through the use of wires connecting a pair of points on the board. This procedure is time consuming, labour intensive, tedious for the operator as well as being error prone in spite of some sophisticated mechanized aids. In addition to its considerable cost, the procedure usually results in an unsightly product prone to snagging of the wires and other problems such as cold solder joints.

DESCRIPTION OF THE PRIOR ART

In the past few years, some efforts have been expended in the solution of that problem. One proposed solution has been to apply overlay conductors using the augmentative replacement process. In this process, the pattern of overlay conductors is defined with a dielectric material applied over the original printed circuit. A polymer metal ink containing iron and nickel is then applied over the dielectric material and cured by exposure to a source of heat. The ink is then plated with copper to make it electrically conductive by immersing it in a copper sulfate bath. When the circuit board is immersed in this bath, a chemical reaction is initiated because of the dissimilar metals—the iron and nickel in the cured ink and the copper in the plating bath. As a result, some of the metal powder in the cured ink dissolves—going into solution as ferric sulfate—and pure copper from the copper sulfate bath takes its place. The process is known as augmentative replacement since the copper in the plating bath augments and replaces the metal powder in the metal ink. However, this process suffers from at least two major drawbacks in addition to its substantial cost. Since the method requires immersion of the printed circuit board in a plating bath, it cannot be used for applying overlay conductors to a printed circuit board assembly. Secondly, the conductivity level of the resulting overlay conductors is not adequate for many applications. This process of applying overlay conductors on a printed circuit board is described in, for example, U.S. Pat. No. 4,487,811.

Another known method of applying overlay conductors to a printed circuit card comprises the steps of defining the overlay pattern with a dielectric film and applying a polymer copper ink. Since the polymer copper ink is barely conductive, it is metallized mechanically, such as by air blowing of copper powder which adheres to the ink. The combination of ink and powder is then cured by exposure to heat. A tin-lead solder is then applied over the cured material to further increase its conductivity to a useful level. Again, because of the exposure to copper powder of the entire unit, this process is not useable with printed circuit board assemblies. However it may be useable as a batch process for the application of overlay conductors on bare printed circuit boards.

There is therefore a need for a practical and economical method of applying overlay conductors on either or both sides of printed circuit board assemblies and especially on the surface having the components mounted thereon.

As mentioned above, the use of so-called polymer conductors is generally known. The term "polymer conductor" is actually a misnomer since the polymer is not actually a conductor but is loaded with a conducting metal and the mechanism by which conductivity is achieved is supplied entirely by the finite proximity of individual metallic particles. It has been found that the only metals which can be loaded into the polymer and give acceptable conductivity are the precious metals such as gold and silver. All of the other standard conducting metals tend to oxidize over a period of time and the conductivity between the particles is reduced. The use of gold is prohibitively expensive and is therefore not practical. The use of silver polymer ink on the other hand, suffers from the major problem that, as is generally known and as is discussed in the above-referenced patent, such silver conductors are generally not solderable to existing land areas because the silver in the polymer ink is leached out by the tin-lead solder. The resulting solder joint is unreliable and often exhibits a very low conductivity.

It is an object of this invention to provide a method of applying overlay conductors to either side of a printed circuit board assembly using silver polymer ink and further, to provide a method of reliably connecting silver polymer conductors to land areas of printed circuit boards.

SUMMARY OF THE INVENTION

In accordance with the invention there is provided a method of applying an overlay conductor between at least a pair of connection land areas on a surface of a printed circuit board. The pattern of the conductor on the board is first defined by the application of a dielectric material between the pair of land areas. A solderable silver polymer ink is then applied over the dielectric material and over only a portion of each land area. The polymer ink is then at least partially cured by exposure to a source of heat. The pair of land areas and at least the portion of the cured ink overlying the land areas are then covered with silver solder paste which is subsequently flowed by exposure to a source of heat whereby the curing of the silver ink is complete.

BRIEF DESCRIPTION OF THE DRAWINGS

Example embodiments of the invention will now be described in conjunction with the drawings in which:

FIGS. 1A-1D illustrate the steps of applying an overlay conductor on a printed circuit board in accordance with the invention;

DESCRIPTION OF PREFERRED EMBODIMENT

Figure 2A:
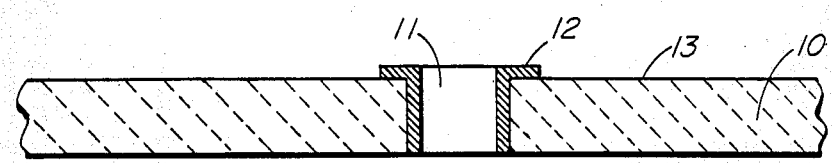
FIGS. 2A-2E are cross-sectional views of the illustrations of FIGS. 1A-1D.
Figure 2B:
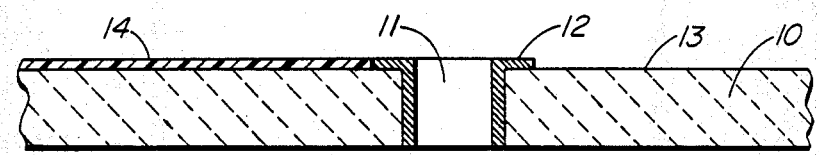
Figure 2C:
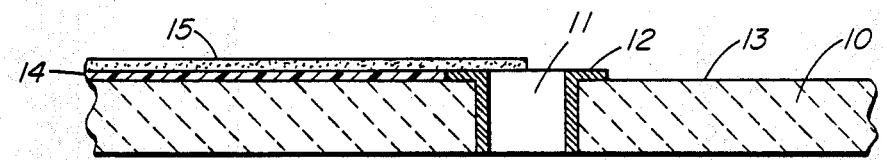
Figure 2D:
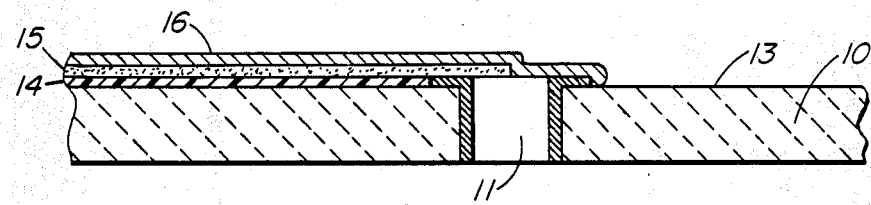
Figure 2E:
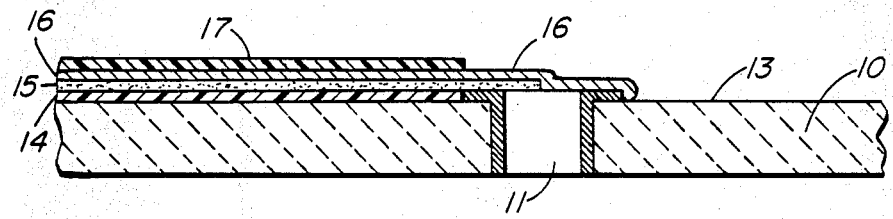
Figure 3A:
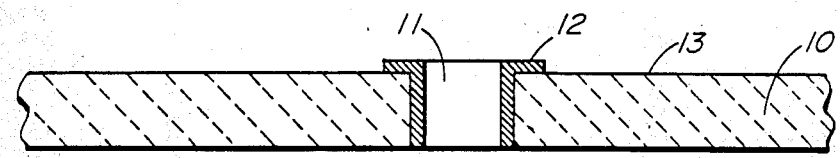
FIGS. 3A-3E are cross-sectional views of an alternate embodiment of the invention.
Figure 3B:
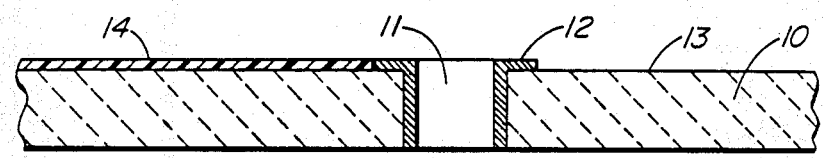
Figure 3C:
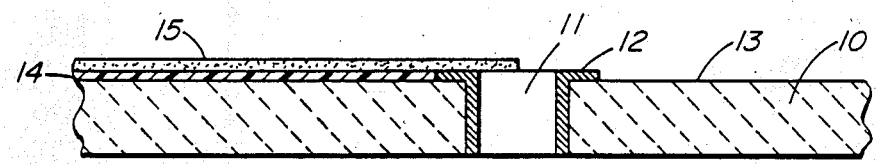
Figure 3D:
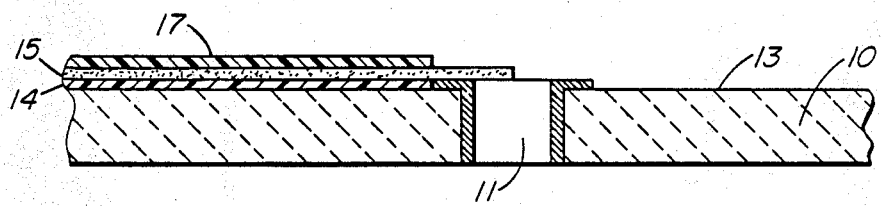
Figure 3E:
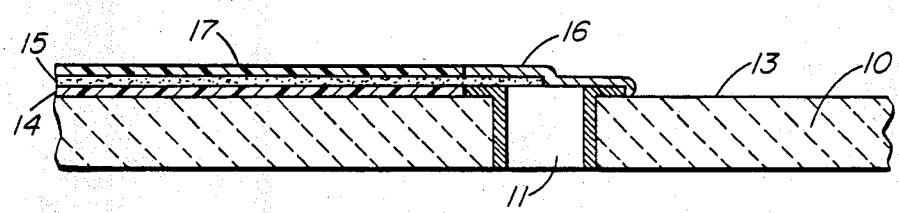

FIGS. 1A-1D and 2A-2E show a printed circuit board 10 having a plated-through hole 11 forming a connection land area 12 on a surface 13 of the board or substrate 10 (FIG. 2A). As is usual, the board 10 would have a pattern of conductors printed on the surface 13 and at some point in time, either before or after components are mounted on the board, it is often necessary to add barnacles or overlay conductors as, for example, from land area 12 to another connection point on the surface 13 of the board 10. The first step in the application of an overlay conductor in accordance with this invention is the application of a layer of dielectric material 14 between the land area 12 and another such land area to isolate electrically the conductors to be formed from the existing conductors on the surface of the printed circuit board. This dielectric material may be a non-conductive polymer ink which is allowed to dry or cure at room temperature or that may be cured by exposure to a source of heat such as infra-red radiation or by ultraviolet radiation.

Although the surface of the land area 12 is shown to be annular, it may of course be of any shape as dictated by the original printed circuit on the surface 13. The second step in the process is to apply a solderable silver polymer ink 15 over the dielectric material 14 to a width narrower than the latter and over only a portion of each of the land areas such as shown particularly in FIG. 1B. As shown in that illustration, the silver ink is applied to an area covering less than the land area 12 and preferably not extending to the perimeter of the plated-through hole 11. This tends to minimize the leaching of the silver from the polymer ink when the hole subsequently becomes filled with tin-lead solder. The silver polymer ink is cured at least partially by exposure to a source of heat and is then covered with a silver solder paste 16 to a width larger than the silver ink 15 but less than the dielectric material 14 and including at least a portion of the land area 12 not covered with the silver ink 15. The silver solder paste is then reflowed and allowed to cool thereby completing the curing of the silver polymer ink. Since the silver solder is easily solderable to the plating material (copper, nickel, or tin-lead solder) of the hole 11, the overlay conductor is securely anchored to the land areas by a highly conductive connection. In addition, the siler solder paste effectively encapsulates and seals the silver polymer ink and thereby prevents silver migration between conductors, dendritic growth, corona degradation, ionic contamination, hydrolytic instability as well as providing a durable surface for handling and cleaning.

The overlay conductor between land areas may then be protected from the environment by applying a second layer of dielectric material 17 along the conductor. This may also be a non-conductive polymer ink that may be cured by exposure to a source of heat or radiation such as ultraviolet rays.

In many cases, the silver polymer ink 15 may provide a conductor of adequate conductivity by itself. In that case, the above-described process may be altered by encapsulating the cured silver ink conductor between land areas with the second layer of dielectric material 17 and curing it. A portion of the land area 12 at least greater than the area covered by the silver polymer ink 15 is then covered with silver solder paste 16 and reflowed to securely connect the overlay conductor to the land area 12. This is illustrated in the sequence of FIG. 3, particularly at FIGS. 3D and 3E.

In another variation of the process, it may be desirable under some circumstances such as type of material and surface condition of the surface receiving the overlay conductor, to provide a double layer of dielectric material 14 to provide greater isolation between the surface of the printed circuit board and the subsequently formed conductor.

The materials used in the above-described process are generally available as off-the-shelf items. For example, the dielectric material may be a non-conductive polymer ink such as type MID-8370-CB, and the solderable silver polymer ink may be type CBS-2181-HEC both available from International Microelectronics Research Corporation, Tucson, Ariz., U.S.A., and the silver solder paste may be type 625 m/36 Pb/2 Ag available from Alpha Metals Incorporated, Jersey City, N.J., U.S.A. The example silver polymer ink is a curable polymer and a solvent and it contains approximately 80% finely divided silver powder by weight whereas the silver solder paste contains about 2% silver by weight.

The overlay conductor pattern may be applied to the surface of a printed circuit board using a variety of well-known application processes such as screen printing, stencilling, transfers and ink dispensers, or a combination of these methods. Whereas all these methods may be used to apply the materials on printed circuit boards only transfers and dispensers can be used to apply the materials on a printed circuit card assembly.

Figure 4:
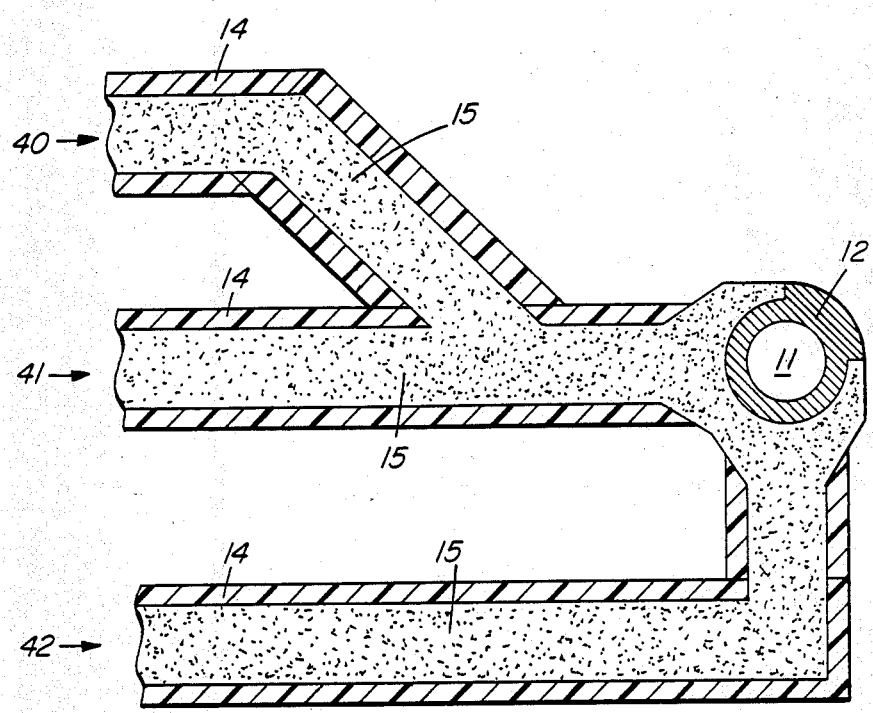
FIG. 4 illustrates a plurality of interconnected conductors applied in accordance with the process of the invention.

FIG. 4 illustrates the method of interconnecting various conductors to each other and to a common land area 12. Conductors 40, 41, and 42 are first defined by their respective first layer of dielectric material 14. Conductors 40 and 41 are then connected by overlaying their respective layer 15 of silver polymer ink. The conductors 41 and 42 may also be interconnected as just described or by stacking or overlaying their respective layer of silver polymer ink covering a portion of the connection land area 12. The silver polymer ink is then cured and the interconnection of these conductors may be completed by either of the two above-described methods. In one case, the silver polymer ink except for the portions covering the land area 12 is covered with a dielectric polymer material and cured; the land area 12 then being covered with silver solder paste which is subsequently reflowed. Alternatively, the silver polymer ink, including the land area 12, is covered with silver solder paste and reflowed. The conductor portions other than the land area 12 may then be covered with a dielectric polymer material.

It may be noted that further connections may be made to the land area at a later date simply by stacking the conductor layers over existing ones.

The invention thus provides a practical method of applying change interconnections to a printed circuit board with or without components mounted thereon. The interconnection conductors may be made highly conductive and their attachment to the original circuitry is highly reliable. In addition, the process results in a product that is aesthetically acceptable.

Various changes and modifications can be made in the process and products of this invention without departing from the spirit and scope thereof. The various embodiments set forth herein were for the purpose of further illustrating the invention but were not intended to limit it.

What is claimed is:

1. A process for applying an overlay conductor on a surface of a printed circuit board comprising the steps of: applying a first layer of dielectric material to a predetermined width along a predetermined path between at least a pair of connection land areas on the surface of a printed circuit board, applying a solderable silver polymer ink over the dielectric material to a width narrower than the latter and over only a portion of each of the land areas, at least partially curing the silver polymer ink by exposure to a source of heat, applying a silver solder paste over at least the silver polymer ink overlaying each of the land areas and over at least a portion of each land area adjacent the portions covered with silver polymer ink, and causing the silver solder paste to reflow by exposure to a source of heat.

2. A process as defined in claim 1 wherein most of the surface of each of the land areas including the portions covered with cured silver polymer ink is covered with silver solder paste and reflowed by exposure to a source of heat.

3. A process as defined in claim 1 wherein the portion of cured silver polymer ink not covered with silver solder paste is covered with a second layer of dielectric material.

4. A process as defined in claim 2 wherein the silver solder paste is also applied over the cured silver polymer ink along the entire length of the conductor to a width narrower than the first layer of dielectric material and wider than the cured silver polymer ink, whereby when the silver solder paste is reflowed, the conductor becomes encapsulated.

5. A process as defined in claim 4 and comprising the further steps of applying a second layer of dielectric material over the reflowed silver solder paste between the land areas.

6. A process as defined in claim 5 wherein the application of said first and second layers of dielectric material comprises the steps of applying a layer of non-conductive polymer ink and curing it by exposure to a source of energy.

7. A process as defined in claim 6 wherein the first layer of dielectric material comprises the steps of applying one layer of non-conductive polymer ink, curing the ink by exposure to a source of energy, applying another layer of polymer ink over the one layer and curing the ink by exposure to a source of energy.

8. A process as defined in claim 7 wherein the source of energy is a source of infra-red radiation.

9. A process as defined in claim 8 whereins the source of energy is a source of ultraviolet radiation.

10. A process for applying an overlay conductor on the surface of a printed circuit board comprising the steps of, applying a first layer of dielectric material to a predetermined width along a predetermined path between at least a pair of connection land areas, applying a solderable silver polymer ink over the dielectric material to a width narrower than the latter and over only a portion of each of the land areas, at least partially curing the silver polymer ink by exposure to a source of heat, applying a silver solder paste over each of the land areas including the portions thereof covered with the cured silver polymer ink, and reflowing the silver solder paste.

11. A process as defined in claim 10 wherein the portion of cured silver polymer ink intended to not be covered with silver solder paste is covered with a second layer of dielectric materal prior to the application of the silver solder paste.

12. A process as defined in claim 11 wherein the silver solder paste is also applied over the cured silver polymer ink along the entire length of the conductor to a width narrower than the dielectric material and wider than the cured silver polymer ink, whereby when the silver solder paste is reflowed, the conductor becomes encapsulated.

13. A process as defined in claim 12 and comprising the further step of applying a second layer of dielectric material over the reflowed silver solder paste between the land areas.

14. A process as defined in claim 13 wherein the application of said first and second layers of dielectric material comprises the steps of applying a layer of non-conductive polymer ink and curing it by exposure to a source of energy.

15. A process as defined in claim 14 wherein the first layer of dielectric material comprises the steps of applying one layer of non-conductive polymer ink, curing the ink by exposure to a source of energy, applying another layer of polymer ink over the one layer and curing the ink by exposure to a source of energy.

16. A process as defined in claim 15 wherein the source of energy is a source of infra-red radiation.

17. A process as defined in claim 16 wherein the source of energy is a source of ultraviolet radiation.

18. A process as defined in claim 10 wherein the silver polymer ink comprises a curable polymer containing about 80% by weight of a finely divided silver powder and the silver solder paste contains about 2% silver by weight.

* * * * *